United States Patent [19]
Hieda

[11] Patent Number: 6,072,221
[45] Date of Patent: *Jun. 6, 2000

[54] SEMICONDUCTOR DEVICE HAVING SELF-ALIGNED CONTACT PLUG AND METALLIZED GATE ELECTRODE

[75] Inventor: Katsuhiko Hieda, Yokohama, Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/105,021

[22] Filed: Jun. 26, 1998

[30] Foreign Application Priority Data

Jun. 30, 1997 [JP] Japan ................................. 9-174199

[51] Int. Cl.$^7$ ............................. A01L 29/76; H01L 29/94; H01L 31/062; H01L 31/113; H01L 31/119
[52] U.S. Cl. ......................... 257/382; 257/384; 257/377; 257/412; 257/413; 257/408; 257/344
[58] Field of Search .................................... 257/336, 344, 257/408, 343, 377, 382, 384, 412, 413; 438/300, 592

[56] References Cited

U.S. PATENT DOCUMENTS

| | | | |
|---|---|---|---|
| 5,334,870 | 8/1994 | Katada et al. | 257/336 |
| 5,455,444 | 10/1995 | Hsue | 257/336 |
| 5,559,357 | 9/1996 | Krivokapic | 257/336 |
| 5,705,839 | 1/1998 | Hsu et al. | 257/336 |
| 5,804,846 | 9/1998 | Fuller | 257/382 |
| 5,828,103 | 10/1998 | Hsu | 257/344 |
| 5,844,274 | 12/1998 | Tsutsumi | 257/343 |
| 5,851,883 | 12/1998 | Gardner et al. | 438/300 |
| 5,866,459 | 2/1999 | Naem et al. | 438/300 |
| 5,895,948 | 4/1999 | Mori et al. | 257/382 |

FOREIGN PATENT DOCUMENTS

| | | | |
|---|---|---|---|
| 401270260 | 10/1989 | Japan | 257/384 |
| 4-123439 | 4/1992 | Japan. | |

OTHER PUBLICATIONS

Lyu et al.; "Metal–Ferroelectric–Semiconductor Field–Effect Transistor (MFSFET) For Single Transistor Memory by Using Poly–Si Source/Drain and BaMgF$_4$ Dielectric", IEDM Technical Digest, Dec. 9, 1996, pp. 503–505.

*Primary Examiner*—David Hardy
*Assistant Examiner*—Jesse A. Fenty
*Attorney, Agent, or Firm*—Finnegan, Henderson, Farabow, Garret & Dunner, L.L.P.

[57] ABSTRACT

In the method of manufacturing a semiconductor device, according to the present invention, first, a dummy gate electrode consisting of a semiconductor layer and a non-metal cap layer formed on the semiconductor layer, is formed above a substrate. Then, diffusion layers are formed respectively on both sides of the dummy gate electrode. The dummy gate is used as a mask here, and thus the diffusion layers are self-aligned respectively with both sides of the dummy gate electrode. The formation of these diffusion layers requires a high-temperature heat treatment, however since the cap layer is made of a non-metal material, it is not melted down even in the high-temperature heat treatment. Next, the cap layer formed on the semiconductor layer is removed, and a gate groove made by the removal is filled with metal. Thus, a metal gate electrode made of a semiconductor layer and a metal layer is completed. As described above, in the present invention, first, a dummy gate electrode is formed of a non-metal cap layer, and the cap layer is removed after the formation of the diffusion layers, followed by filling the created gate groove with a metal. In this manner, the self-alignment of the diffusion layers and the metallization of the gate electrode can be achieved at the same time.

12 Claims, 9 Drawing Sheets

SEMICONDUCTOR DEVICE HAVING SELF-ALIGNED CONTACT PLUG AND METALLIZED GATE ELECTRODE

BACKGROUND OF THE INVENTION

1. Field of the Invention

The present invention relates to a semiconductor device which can be manufactured by using, in the same manufacturing process, both the technique of forming a contact plug of the source-drain by a self-alignment method, with respect to a gate electrode, and the technique of metallizing a gate electrode, and to a method of manufacturing such a device.

2. Description of Related Art

In order to downsize the MOS transistor and increase the operation speed at the same time, it is essential to decrease the resistance of the gate electrode. The most popular technique for decreasing the resistance is to use a so-called "polycide gate electrode", in which a silicide layer is formed on a polysilicon layer. In order to further decrease the resistance of the "polycide gate electrode", it is required to increase the height of the gate electrode. However, as the height of the gate electrode is increased, the process for self-aligning a contact such as a drain with respect to a gate electrode, becomes more difficult.

In order to break through the limit of a low resistance of the "polycide gate electrode", there has been conventionally proposed a so-called "polymetal gate electrode", in which, in place of the silicide layer, a metal layer made of tungsten (W layer) or the like is laminated on a polysilicon layer.

However, the "polymetal gate electrode" entails the drawbacks that it is very difficult to perform a post-oxide film forming process for the gate electrode, which is carried out to improve the breakdown voltage of the gate insulation film, and it is difficult to perform a self-alignment process of the contact with respect to the gate electrode.

For example, in the case where silicides 73a and 73b are formed, as can be seen in FIG. 1, on a source-drain layer 71 and a gate electrode 72, respectively, by a self-alignment method, the following problem occurs. That is, since a silicon nitride layer cannot be formed on a polycide-gate electrode, it is very difficult to form a contact plug of the source-drain layer 71 by the self-alignment method with respect to the gate electrode 72.

Further, in the case of a so-called "polymetal-gate electrode" structure in which a metal member 75 such as tungsten is adhered onto the gate electrode of the polysilicon layer 74 via a barrier metal such as of tungsten nitride as can be seen in FIG. 2, so as to decrease the resistance of the gate electrode, there arises an additional problem other than that it is difficult to form a contact plug of the source-drain layer 71 by the self-alignment method with respect to the gate electrode since a silicon nitride layer cannot be formed on the gate electrode. That is, the process for forming a post oxide film of the gate electrode, which is carried out to enhance the breakdown voltage of the gate insulation film, requires a very special oxidization condition.

As described above, in the case where the gate electrode of a transistor is metallized, it does not have a heat resisting property to stand a high-temperature heat treatment step, and it is very difficult to make a contact self-aligned with respect to the gate electrode.

BRIEF SUMMARY OF THE INVENTION

The object of the present invention is to provide a semiconductor device which can be manufactured by using, in the same manufacturing process, both the technique of forming a diffusion layer of the source-drain by a self-alignment method, with respect to a gate electrode, and the technique of metallizing a gate electrode, and to a method of manufacturing such a device.

In the method of manufacturing a semiconductor device, according to the present invention, first, a dummy gate electrode consisting of a semiconductor layer and a non-metal cap layer formed on the semiconductor layer, is formed above a substrate. Then, diffusion layers are formed respectively on both sides of the dummy gate electrode. The dummy gate is used as a mask here, and thus the diffusion layers are self-aligned respectively with both sides of the dummy gate electrode. The formation of these diffusion layers requires a high-temperature heat treatment; however since the cap layer is made of a non-metal material, it is not melted down even in the high-temperature heat treatment. Next, the cap layer formed on the semiconductor layer is removed, and a gate groove made by the removal is filled with metal. Thus, a metal gate electrode made of a semiconductor layer and a metal layer is completed. As described above, in the present invention, first, a dummy gate electrode is formed of a non-metal cap layer, and the cap layer is removed after the formation of the diffusion layers, followed by filling the created gate groove with a metal. In this manner, the self-alignment of the diffusion layers and the metallization of the gate electrode can be achieved at the same time.

It is possible that the metal gate electrode consisting of, not a semiconductor layer and a metal layer formed on the semiconductor layer as described above, but only a metal. In this case, the dummy gate electrode is made of, not a semiconductor layer and a cap layer as above, but a non-metal single layer.

Further, in order to fill the gate groove with metal, it is effective if the metal is deposited on the entire surface first, and then it is chipped off to the height equal to the level of the gate groove by CMP or the like. In this case, the height of a contact plug naturally becomes substantially equal to that of the metal gate electrode.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

DETAILED DESCRIPTION OF THE INVENTION

The present invention will now be described in further detail in connection with preferred embodiments thereof, with reference to drawings.

First Embodiment

Figure 1:
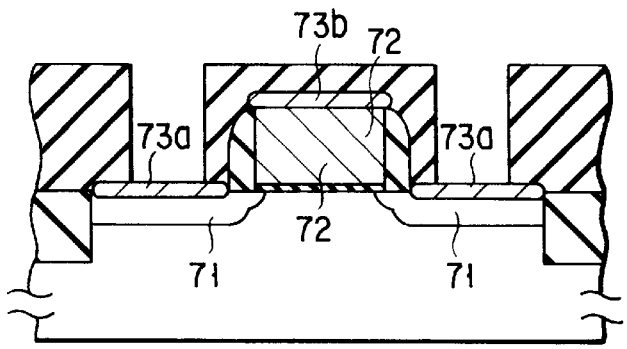
FIG. 1 is a diagram showing a cross sectional view of a conventional silicide gate electrode.
Figure 2:
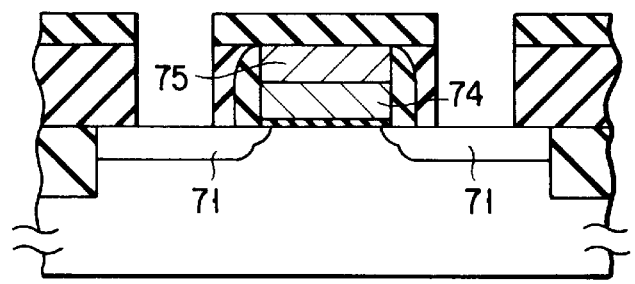
FIG. 2 is a diagram showing a cross sectional view of a conventional metal gate electrode.
Figure 3A:
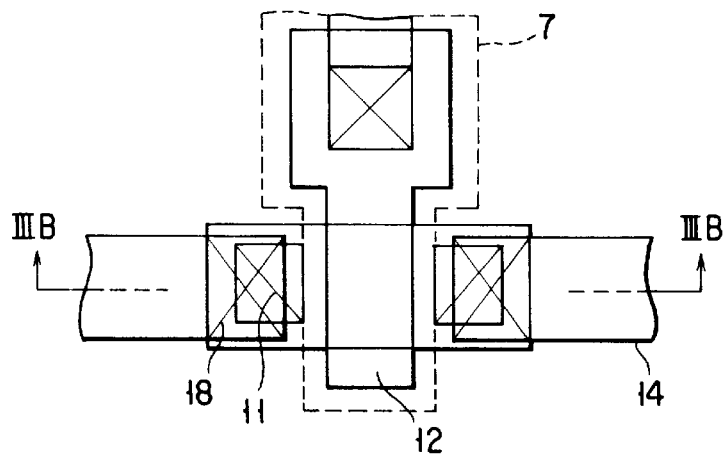
FIG. 3A is a diagram showing a plan view of a transistor according to the first embodiment of the present invention.
Figure 3B:
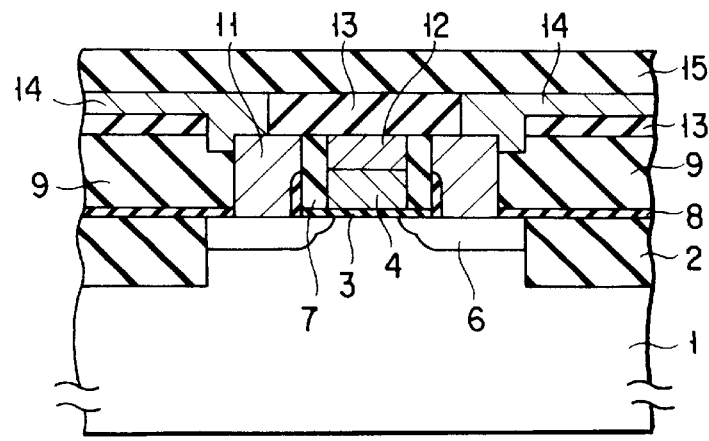
FIG. 3B is a diagram showing a cross sectional view of the transistor shown in FIG. 3A, taken along the line IIIB—IIIB.

FIG. 3A is a plan view of a transistor according to the first embodiment of the present invention. FIG. 3B is a cross sectional view taken along the line IIIB–IIIB' of FIG. 3A. The manufacturing steps for the transistor are shown in FIGS. 4A to 4F in the form of cross sectional views.

Figure 4A:
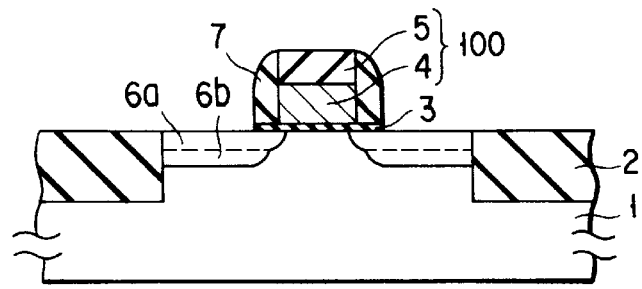
FIG. 4A is a diagram showing a cross sectional view of a product in process after the diffusion layer forming step of the manufacturing process of a transistor, according to the first embodiment of the present invention.

First, as can be seen in FIG. 4A, in a (100) plane of a p-type silicon substrate 1 having an impurity concentration of about $5 \times 10^{15}$ cm$^{-3}$, a p-well is formed in an n-channel transistor forming region and an n-well is formed in a p-channel transistor forming region. It should be noted that the substrate 1 may be a p-type silicon substrate, an n-type silicon substrate, or a so-called epitaxial substrate prepared by growing a p-type (or n-type) epitaxial Si layer to have a thickness of about 1 $\mu$m on the surface of a p-type silicon substrate or an n-type Si substrate.

After that, a trench is made in the Si substrate 1 by, for example, a reactive ion etching (RIE) method. The trench is an STI (shallow trench isolation) having a depth of about 0.2

μm. The trench is filled with an insulation film so as to form a trench-type element separation layer 2. In the channel region, a channel-ion injection layer for controlling the threshold voltage (Vth) of the transistor is formed. Thus, a gate insulation film 3 of $SiO_2$ is formed to have a thickness of about 6 nm.

Subsequently, a dummy gate electrode 100 consisting of a semiconductor layer 4 having a thickness of about 100 nm and a cap layer 5 having a thickness of about 150 nm and formed on the semiconductor layer 4, is formed on the gate insulation film 3 by means of, for example, a lithographic technique and RIE technique. The semiconductor layer 4 is made of, for example, $n^+$ polysilicon. The cap layer 5 is made of a non-metal material such as $Si_3N_4$.

It should be noted that after the above process, a so-called "post oxidization" is carried out in some cases, which slightly increases the thickness of a gate oxide layer at a lower edge of the polysilicon layer, for the purpose of improving the breakdown voltage of the gate electrode and source-drain.

Next, in order to form an LDD (lightly doped drain), phosphorus ion ($P^+$) is injected to the surface portion of the substrate 1. The conditions of the ion implantation are an acceleration voltage of 70 keV and a dose amount of $4\times10^{13}cm^{-2}$. With this operation, an $n^-$-type diffusion layer 6a is formed at both sides of the dummy gate electrode 31.

The dummy gate electrode 100 consists of the nonmetal semiconductor layer 4 and the cap layer 5, and therefore it does not melt down in the same manner as metal. Therefore, the dummy gate electrode 100 can be used as a mask. Thus, the diffusion layer 6a is self-aligned to be adjacent to each side of the dummy gate electrode 100.

Subsequently, $SiO_2$ is deposited on the entire surface of the substrate, and then the $SiO_2$-deposited entire surface is treated by RIE. Thus, the dummy gate electrode 100 is surrounded by a side-wall insulating film 7 having a thickness of 30 nm and made of $SiO_2$. Then, the implantation of, for example, arsenic ion ($As^+$) is carried out under the conditions that an acceleration voltage of 30 keV and a dose amount of about $5\times10^{15}cm^{-2}$. Thus, an $n^+$-type diffusion layer 6b is formed underneath the diffusion layers 6a. Thus, an LDD structure is completed.

It should be noted that in place of the LDD structure, a single layer of $n^-$-type diffusion layer 6a or $n^+$-type diffusion layer 6b may be employed.

Figure 4B:
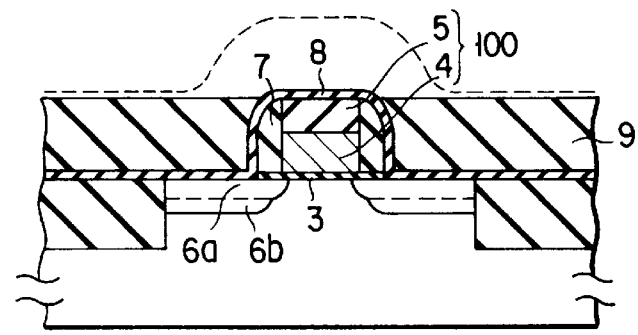
FIG. 4B is a diagram showing a cross sectional view of the product in process after the stopper film forming step which follows the step shown in FIG. 4A.

Next, as can be seen in FIG. 4B, a stopper film 8 made of $Si_3N_4$ is deposited to have a thickness of as thin as about 20 nm, on the entire surface of the substrate. Then, an interlayer insulation film 9 such as a BPSG film is deposited to have a thickness of 300 nm. It should be noted here that a thin $SiO_2$ layer having a thickness of about 8 nm may be sandwiched between the stopper film 8 and the Si substrate 1. With the insertion of such an $SiO_2$ layer, it becomes possible to remove the stopper film 8 without causing damage to the Si substrate 1 in a later step.

After that, the densification is carried out under the conditions of about 800° C., in an $N_2$ atmosphere and about 30 minutes. At the same time, the source-drain diffusion layers 6a are activated. In the case where it is required to decrease the depth (Xj) of the diffusion layer 6a, the temperature condition for the densification should be decreased to about 750° C., and the activation of the ion implantation layer is carried out together with an RTA (rapid thermal anneal) process at 950° C. for about 10 seconds.

After that, the deposited BPSG film is polished by the CMP (chemical mechanism polishing) so as to smooth it, and therefore the surface of the stopper $Si_3N_4$ film 8 on the gate pattern is exposed. Thus, an interlayer insulating film 9 having a thickness of 250 nm is formed. The interlayer insulation film 9 has almost the same height as that of the gate electrode 100 and the side wall insulating film 7.

Figure 4C:
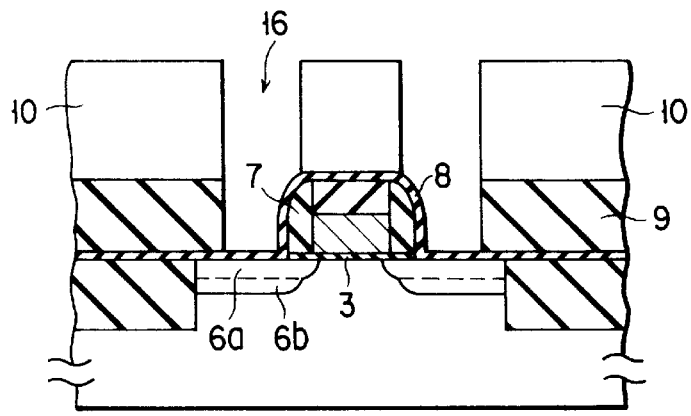
FIG. 4C is a diagram showing a cross sectional view of the product in process after the plug hole forming step which follows the step shown in FIG. 4B.

Next, as can be seen in FIG. 4C, an isotropic etching process (RIE) is carried out on the interlayer insulation film 9 with use of a resist mask 10 formed by a lithographic method using an ordinary resist. The conditions for the selection etching are set such that the interlayer insulation film 9 is etched without etching the stopper film 8, or the etching rate for the stopper film 8 is significantly lower than the etching rate for the interlayer insulating film 9. With such an etching process, a plug hole to which a contact plug is filled in a later step, is made in the interlayer insulation film 9.

Figure 4D:
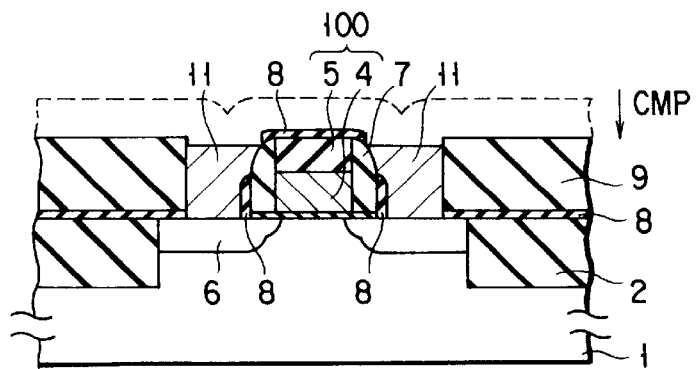
FIG. 4D is a diagram showing a cross sectional view of the product in process after the contact plug forming step which follows the step shown in FIG. 4C.

Next, as shown in FIG. 4D, the portion of the stopper film 8, which is located above the diffusion layer 6a in the plug hole 16, is removed by the RIE using the resist mask 10, in order to expose the surface of the diffusion layer 6a. In this step, it is possible that parts of the stopper film 8 remain on the side wall insulation film 7; however the remainders would not cause a serious problem in terms of the characteristics of the transistor. As described in connection with the case shown in FIG. 4B, in the case where an $SiO_2$ layer is sandwiched between the stopper film 8 and the Si substrate 1, the layer should be removed as well. After that, the resist mask 10 is removed.

Next, a metal layer is deposited on the entire surface of the substrate by, for example, a CVD method or a sputtering method. Examples of the metal are tungsten (W), Ru, Ti, TiN and tungsten nitride ($WN_x$) or a laminate of any of these. In consideration of the adhesion to the Si substrate and the reduction of the contact resistance, a lamination structure having a Ti layer, TiN layer and tungsten (W) layer laminated in this order one on another such as W/TiN/Ti, is preferable.

After that, the deposited metal layer is etched back by the CMP until the surface of the interlayer insulation film 9 is exposed. Thus, the necessary portion of the metal layer remains in the plug hole, and thus a contact plug 11 is completed. With the CMP, the contact plug 11, the interlayer insulation film 9, the dummy gate electrode 100 and the side wall insulation wall 7 are leveled with each other at substantially the same height. The conditions for the CMP are set so that the CMP rate for the metal is slightly higher than those of the side wall insulation film 7, the interlayer insulation film 9, the stopper film 8 and the cap layer 5. With such conditions, it is possible that the contact plug 11 of the metal becomes slightly shorter than the interlayer insulation film 9 and the side wall insulation film 7, thus making a recess; however it would not cause a problem in terms of the characteristics of the transistor.

Figure 4E:
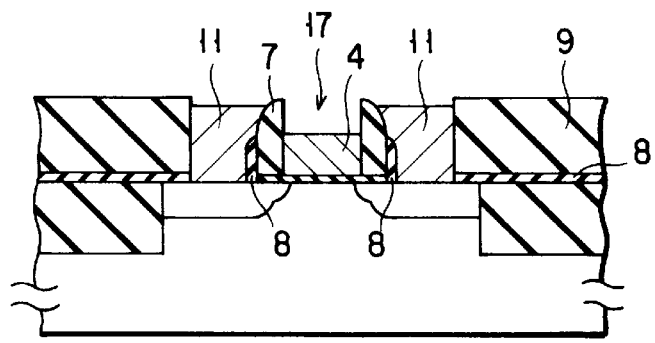
FIG. 4E is a diagram showing a cross sectional view of the product in process after the cap layer removing step which follows the step shown in FIG. 4D.

Next, as can be seen in FIG. 4E, the exposed portions of the stopper film 8 and cap layer 5 are selectively removed with, for example, a hot phosphate solution. Thus, a gate patterned groove 17, which is surrounded by the side wall insulation film 7 is opened, and the surface of the polysilicon layer 4 is exposed as the bottom of the groove 17.

Figure 4F:
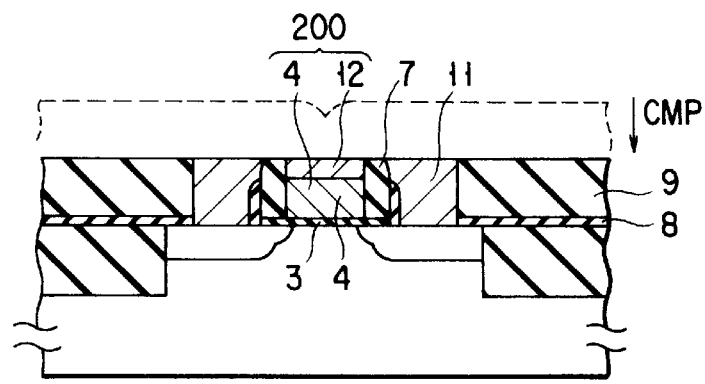
FIG. 4F is a diagram showing a cross sectional view of the product in process after the metal layer forming step which follows the step shown in FIG. 4E.

Then, as shown in FIG. 4F, a metal is deposited on the entire surface of the substrate by the CVD method, the sputtering method or the like. The metal is a single or lamination layer of tungsten (W), Ru, TiN and tungsten nitride ($WN_x$). Then, the deposited metal is etched back until the surface of the interlayer insulation film 9 is exposed by the CMP. Thus, the metal regionally remains in the gate patterned groove 17, thereby forming a metal layer 12. Thus, a polymetal gate electrode 200 consisting of the polysilicon layer 4 and the metal layer 12 is completed.

Figure 5:
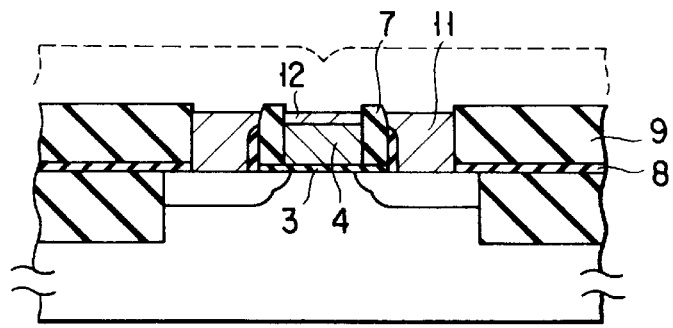
FIG. 5 corresponds to FIG. 4F and is a diagram showing a cross sectional view of the product in process in a state which can occur depending upon chemical etching conditions of the CMP, that is, a state in which the metal layer and the contact plug are slightly decreased in height as compared to the gate side wall insulating film and the interlayer insulation film.
Figure 6:
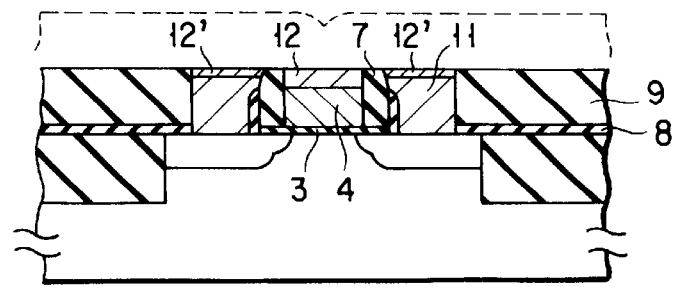
FIG. 6 corresponds to FIG. 4F and is a diagram showing a cross sectional view of the product in process in a state in which a metal layer is left over on the surface of the contact plug.

With the CMP, the contact plug 11, the polymetal gate electrode 200 (metal layer 12), the side wall insulation wall 7 and the interlayer insulation film 9 are leveled with each other at substantially the same height. Here, it is preferable that the conditions for the CMP should be set so that the CMP rate for the metal is slightly higher than those of the side wall insulation film 7 and the interlayer insulation film 9. With such conditions, it is possible that the contact plug 11 and the metal layer 12 of the polymetal gate electrode 200 become slightly shorter than the interlayer insulation film 9 and the side wall insulation film 7, thus making a recess as shown in FIG. 5, or that a metal layer portion originally the same as the metal layer 12 of the polymetal gate electrode 200 remains on the surface of the contact plug 11; however it would not cause a problem in terms of the characteristics of the transistor.

Next, a contact and wiring of the diffusion layer are formed. Although it is also possible to form a wiring by patterning an Al layer by the RIE method using a resist mask, the present invention will be described in connection with the case where a contact and wiring are formed by a dual damascene method as below.

Figure 7A:
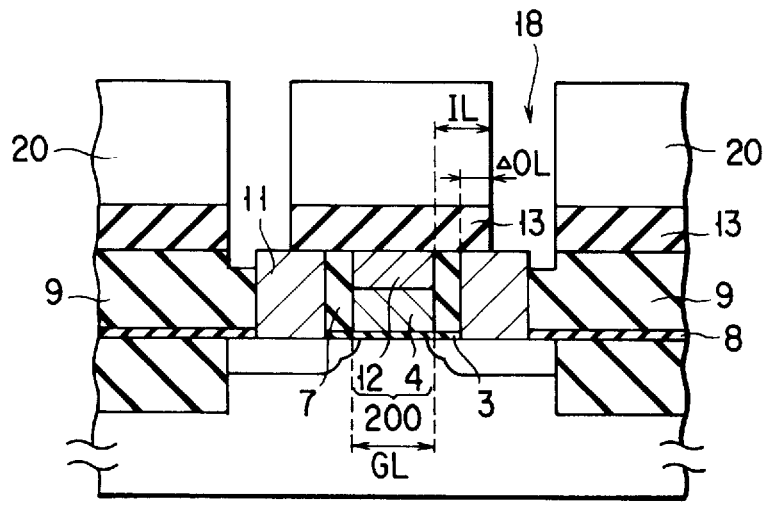
FIG. 7A is a diagram showing a cross sectional view of the product in progress after the first stage of the wiring pattern forming step which follows the step shown in FIG. 4F.

First, as can be seen in FIG. 7A, an SiO$_2$ layer 13 is deposited to have a thickness of about 300 nm on the surface of the substrate, by a plasma TEOS method. Further, a resist mask 20 having a contact pattern is formed on the entire surface by the lithography method. Then, a contact hole 18 for the contact plug 11 and a contact to the polymetal gate electrode 200 are made by the RIE method.

During this operation, the contact hole 18 is shifted in the direction away from the gate electrode 200 by an overlay error ($\Delta$OL) which corresponds to the width (GL) of the polymetal gate electrode 200, with respect to the contact plug 11. This shifting is necessary to guarantee the prevention of an electrical short-circuit between a contact 14' buried in the contact hole 18 in a later step (see FIG. 7C), and the polymetal gate electrode 200.

Figure 8:
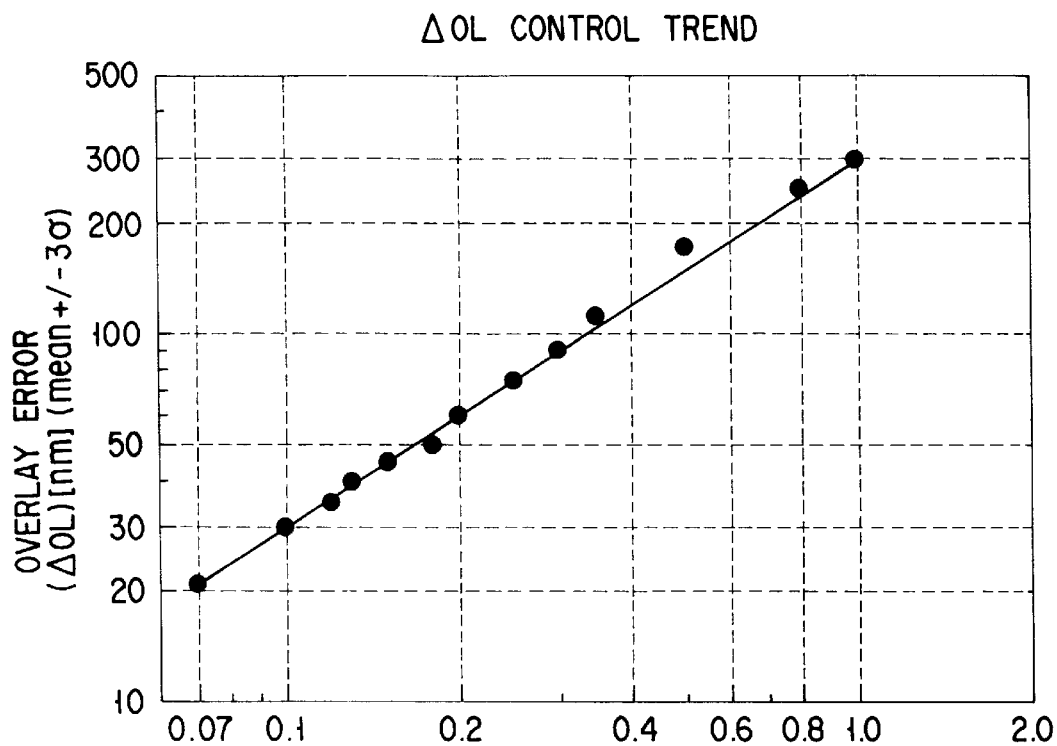
FIG. 8 is a graph illustrating the relationship between the minimum gate length (GL) (corresponding to the design rule) and an overlay error ($\Delta$OL) in the first stage shown in FIG. 7A.

The overlay error ($\Delta$OL) is determined on the basis of the minimum value of gate widths of a plurality of polymetal gate electrodes 200 formed on the same chip, with reference to the allocation accuracy of the lithographic method. FIG. 8 shows the relationship between the gate width (GL) and the overlay error ($\Delta$OL). For example, when the minimum gate width (GL) is 0.15 $\mu$m, the overlay error is designed to be about 50 nm. In this case, the isolation length (IL) between the polymetal gate electrode 200 and the contact 14' will be a total of an overlay ($\Delta$OL) and a thickness of the side wall insulation film 7, that is, 50 nm+30 nm=80 nm, and therefore a sufficient margin can be obtained. When the minimum gate width (GL) is 0.1 $\mu$m, the overlay error should be designed to be 30 nm, but it is designed practically to be 40 nm. In this case, similarly, the isolation length (IL) between the polymetal gate electrode 200 and the contact 14' will be a total of an overlay ($\Delta$OL) and a thickness of the side wall insulation film 7, that is, 40 nm+30 nm=70 nm, and therefore a sufficient margin can be obtained.

Figure 7B:
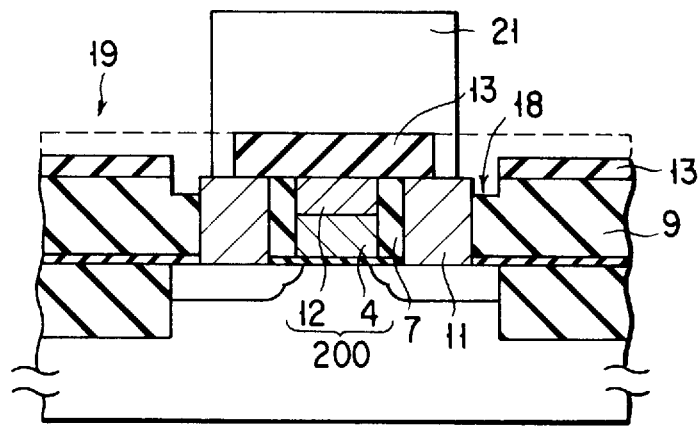
FIG. 7B is a diagram showing a cross sectional view of the product in progress after the second stage which follows the stage shown in FIG. 7A.

Subsequently, a contact and wiring are formed by a so-called dual damascening method in the following manner. First, as shown in FIG. 7B, a resist pattern mask 21 having a hole corresponding to a wiring section, is formed by an ordinary lithography method. Next, a wiring slit 19 is made in the SiO$_2$ layer 13 by the RIE method. The depth of the wiring slit is about 0.25 $\mu$m.

Figure 7C:
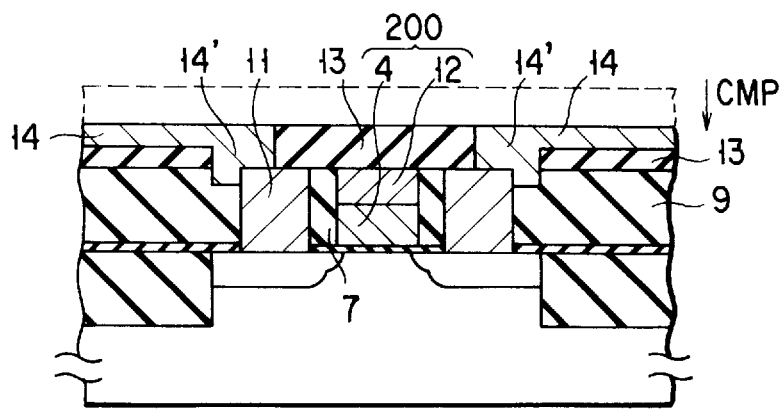
FIG. 7C is a diagram showing a cross sectional view of the product in progress after the third stage (final stage) which follows the stage shown in FIG. 7B.

Next, as can be seen in FIG. 7C, after the resist pattern mask 21 is removed, Al—Cu is filled into the contact hole 18 and the wiring slit 19 by a way of reflow in a high-temperature sputtering method. Then, the metal (Al—Cu) is subjected to the CMP under the CMP conditions. Thus, Al—Cu is left in the contact hole 18 and the wiring slit 19. The metal (Al—Cu) portion which remains in the contact hole 18 constitutes the contact 14' and the metal (Al—Cu) portion which remains in the wiring slit 19 constitutes the wiring 14.

As described above, with this embodiment, the self-alignment of the diffusion layer and the metallization of the gate electrode can be achieved in the same manufacturing process.

Second Embodiment

The second embodiment of the present invention will now be described. As compared to the first embodiment which employs the polymetal gate electrode, this embodiment employs a metal gate electrode made of metal only. Similar structural elements as those of the first embodiment will be designated by the same reference numerals.

Figure 9A:
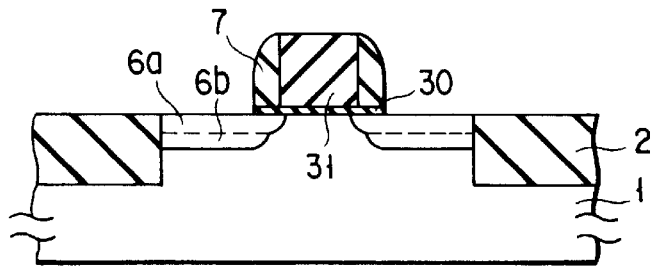
FIG. 9A is a diagram showing a cross sectional view of a product in process after a diffusion layer forming step of a process for manufacturing a transistor, according to the second embodiment.

First, as can be seen in FIG. 9A, in a (100) plane of a p-type silicon substrate 1, a p-well is formed in an n-channel transistor forming region and an n-well is formed in a p-channel transistor forming region.

Then, a trench is made in the Si substrate 1 by, for example, an RIE method, and an element separation layer 2 is formed in the trench. Further, in a desired channel region, a channel-ion injection layer for controlling the threshold voltage (Vth) of the transistor is formed. Then, an SiO$_2$ layer 30 is formed, and a silicon nitride layer 31 is deposited to have a thickness of, for example, about 200 nm on the SiO$_2$ layer 30. Subsequently, a dummy gate electrode 31 consisting of an Si$_3$N$_4$ single layer is formed by the lithographic technique and RIE technique. Next, in order to form an LDD (lightly doped drain), phosphorus ion (P$^+$) is injected to the surface portion of the substrate 1. The conditions of the ion implantation are an acceleration voltage of 70 keV and a dose amount of $4 \times 10^{13}$cm$^{-2}$. With this operation, an n$^-$-type diffusion layer 6a is formed at both sides of the dummy gate electrode 31. This dummy gate electrode 31 can be used as an implant mask of the layer 6a. Thus, the diffusion layer 6a is self-aligned to the dummy gate electrode 31. Next, a side wall insulation film 7 is formed on side walls of the dummy gate electrode 31. After that, an n$^+$-type diffusion layer 6b is formed underneath each of the n$^-$-type diffusion layers. Thus, a so-called LDD structure is completed. It should be noted that this embodiment employs an LDD structure; however, it is also possible to employ a so-called single source-drain structure of only n$^-$-type diffusion layers or only n$^+$-type diffusion layer. Further, in the case where a dummy gate pattern or an SiO$_2$ layer of the LDD is formed, it is important to set such etching conditions that the Si substrate 1 is not damaged from the etching.

Figure 9B:
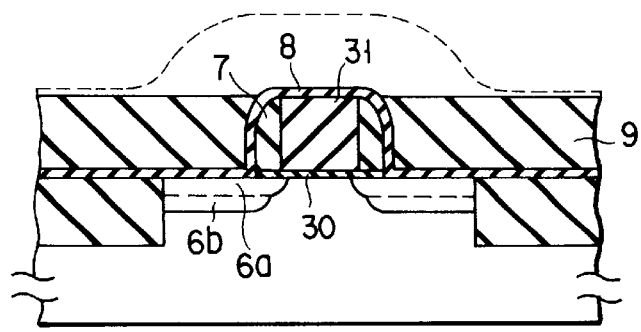
FIG. 9B is a diagram showing a cross sectional view of the product in process after the stopper film forming step which follows the step shown in FIG. 9A.

Next, as can be seen in FIG. 9B, a stopper film 8 is deposited on the entire surface of the substrate. Then, an interlayer insulation film 9 such as a BPSG film is deposited to have a thickness of 400 nm. It should be noted here that a thin SiO$_2$ layer (not shown) having a thickness of about 5 nm may be formed in the interface between the stopper film 8 and the Si substrate 1, although it is omitted in this embodiment. With the insertion of such an SiO$_2$ layer, it becomes possible to remove the stopper film 8 without causing damages due to etching, to the Si substrate 1 in a later step.

After that, the deposited BPSG film a is polished by the CMP (chemical mechanism polishing) so as to smooth it, and therefore the surface of the stopper Si$_3$N$_4$ film 8 on the gate pattern is exposed. Thus, an interlayer insulating film 9 having a thickness of 250 nm is formed. The interlayer insulation film 9 has substantially the same height as that of the gate electrode 100 and the side wall insulating film 7.

Then, the densification (melting) is carried out under the conditions of about 800° C., in an $N_2$ atmosphere and for about 30 minutes, so as to get rid of fine scratches made in the CMP. This heat treatment also serves to activate the source-drain diffusion layers 6a and 6b.

Figure 9C:
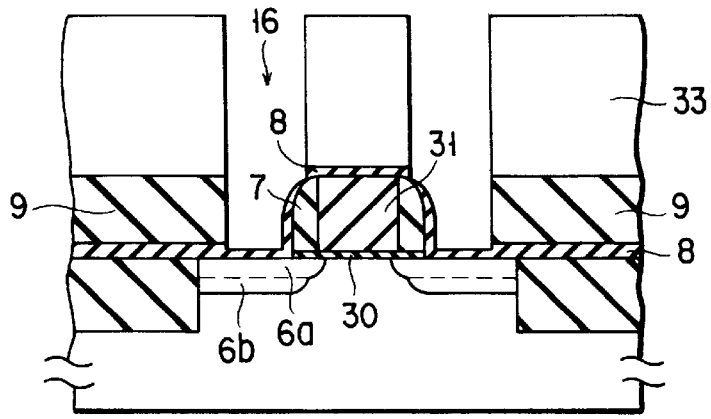
FIG. 9C is a diagram showing a cross sectional view of the product in process after the plug hole forming step which follows the step shown in FIG. 9B.

Next, as can be seen in FIG. 9C, a desired plug hole pattern mask 33 is formed by an ordinary lithographic method, and the interlayer insulation film 9 of BPSG or the like, is etched by an isotropic etching process (RIE). Thus, a plug hole 16 is made.

Figure 9D:
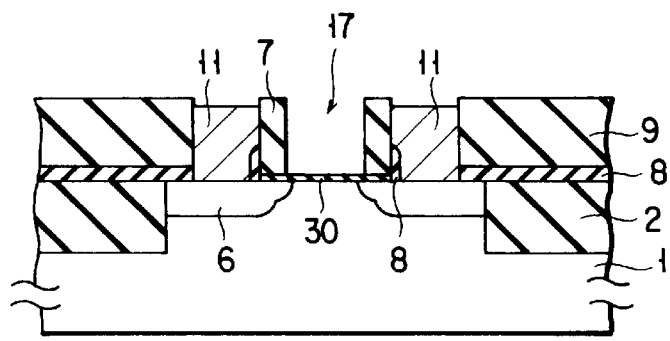
FIG. 9D is a diagram showing a cross sectional view of the product in process after the contact plug forming dummy gate removal steps which follow the step shown in FIG. 9C.

Next, as shown in FIG. 9D, after removing the resist mask 33, the portion of the stopper film 8, which is located at the bottom of the plug hole 16, is removed by the RIE or the like, in order to expose the surface of the diffusion layer 6a.

Subsequently, a metal such as tungsten, Ru, Ti, TiN and tungsten nitride ($WN_x$) or a laminate of any of these, is filled into the plug hole 16. Thus, a contact plug 11 is formed.

After that, the exposed stopper film 8 dummy gate electrode 31 are selectively removed, and thus a gate patterned groove 17 surrounded by the side wall insulating film 7 is made.

Figure 9E:
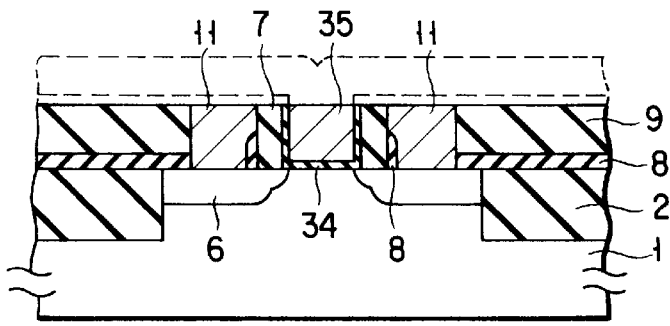
FIG. 9E is a diagram showing a cross sectional view of the product in process after the metal gate electrode forming step which follows the steps shown in FIG. 9D.

Subsequently, as can be seen in FIG. 9E, the portion of the $SiO_2$ layer 30, which is exposed as the bottom of the gate patterned groove 17, is removed, and in place, a gate insulation film 34 is formed on the bottom of the gate patterned groove 17. The gate insulation film 34 is formed of a high dielectric substance (such as $Ta_2O_5$ or $(Ba,Sr)TiO_3$), to have a thickness of about 20 nm. It is also possible here to deposit a high dielectric layer via, for example, a thin $SiO_2$ layer having a thickness of about 1 nm, or a layer obtained by directly nitriding the Si surface in an $NH_3$ gas atmosphere using an interface RTP (Rapid Thermal Process), or an $Si_3N_4$ layer, in order to suppress the creation of an interfacial level or the like between the insulation and the Si interface. Alternatively, it is also possible to use a $CVD-SiO_2$ layer, a $CVD-SiO_xN_y$ layer or a laminate including a $CVD-Si_3N_4$ as the gate insulation film 34. In these alternative cases, the densification may be carried out by performing a heat process by RTA at a temperature of 1000° C. for about 10 seconds after the layer is formed. In this manner, the insulating properties characteristics as an insulation film can be improved, that is, the interfacial level at the Si interface is decreased, or the leak current is decreased. It is very important here to select such conditions that the contact properties between the contact plug 11 and the Si substrate would not be deteriorated.

Then, a metal layer (35) (Ru, TiN, W and tungsten nitride ($WN_x$)) is deposited to have a single or lamination structure such as W/TiN, on the entire surface of the substrate. Naturally, in the case where the gate insulation film is made of a $CVD-SiO_2$ layer, a CVD-SiON layer or a laminate including a $CVD-Si_3N_4$, it is possible to use polycrystalline Si to which an impurity is doped, as a gate electrode.

Then, the deposited metal is etched back until the surface of the interlayer insulation film 9 is exposed by the CMP. Thus, the metal regionally remains in the gate patterned groove 17, thereby forming a metal gate electrode.

With the CMP, the contact plug 11, the metal gate electrode 35, the side wall insulation wall 7 and the interlayer insulation film 9 are leveled with each other at substantially the same height. Here, it is preferable that the conditions for the CMP should be set so that the CMP rate for the metal is slightly higher than those of the side wall insulation film 7 and the interlayer insulation film 9. With such conditions, it is possible that the contact plug 11 and the metal gate electrode 35 become slightly shorter than the interlayer insulation film 9 and the side wall insulation film 7, thus making a recess, or that a metal layer portion originally the same as the metal gate electrode 35 remains on the surface of the contact plug 11; however it would not cause a problem in terms of the characteristics of the transistor.

Next, an $SiO_2$ layer serving as an interlayer insulation film is deposited to have a thickness of about 200 nm, on the entire surface of the substrate. After that, a contact (not shown) to the source-drain, and a contact (not shown) to the gate electrode are opened, and an Al layer serving as a wiring layer is patterned to form a wiring (not shown). Further, a passivation layer (not shown) is deposited and thus the basic structure of a transistor is completed. Naturally, the wiring method which uses a dual damascening technique, described in the first embodiment, may be used.

With the above-described manufacturing method, a similar effect to that of the first embodiment will be evident.

Third Embodiment

Figure 10:
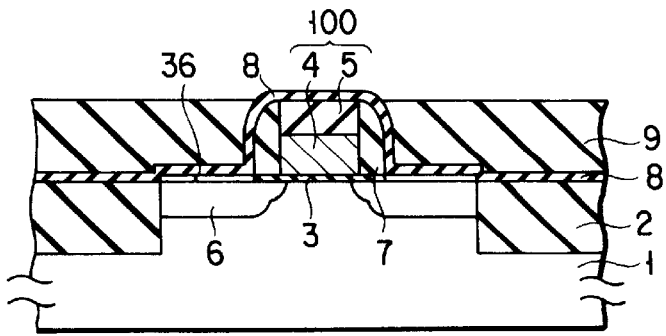
FIG. 10 is a diagram showing a cross sectional view of a product in process, having a silicon oxide film formed between a substrate and a stopper film, in a stopper film forming step in a manufacturing process according to the third embodiment of the present invention.

The third embodiment of the present invention will now be described. In this embodiment, as shown in FIG. 10, when a stopper film 8 is deposited to have a thickness of, for example, 20 nm, on the entire surface of a substrate, and then an interlayer insulating film 9 such as of BPSG or the like, is deposited to have a thickness of, for example, about 400 nm, a thin $SiO_2$ layer 36 having a thickness of about 5 nm is formed by a heat oxidization or the like between the stopper film 8 and Si substrate 1. With this structure, damages which may be caused to the Si substrate when the stopper film 8 is removed, can be completely avoided or significantly lessened.

Fourth Embodiment

The fourth embodiment of the present invention will now be described. In this embodiment, a silicide layer of titanium (Ti) or cobalt (Co) is selectively formed on the surface of the source-drain diffusion layer, in place of the ordinary source-drain diffusion layer, for the purpose of decreasing the resistance of a shallow source-drain diffusion layer.

Figure 11:
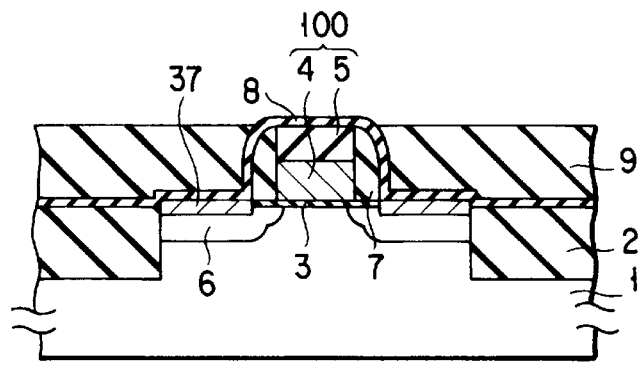
FIG. 11 is a diagram showing a cross sectional view of a product in process, having the diffusion layer a surface of which is made of silicide, in a diffusion layer forming step in a manufacturing process according to the fourth embodiment of the present invention.
Figure 12:
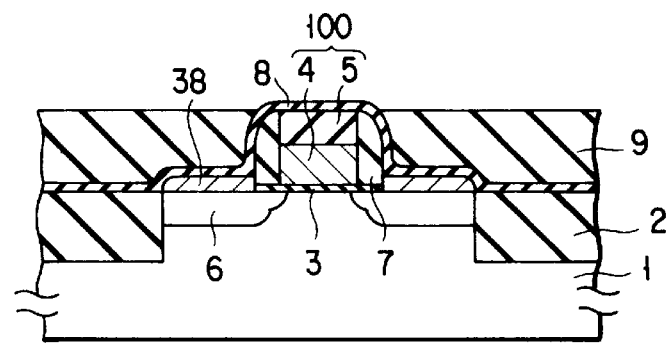
FIG. 12 is a diagram showing a cross sectional view of a product in process, having an epitaxial Si layer formed on the diffusion layer, in a diffusion layer forming step in a manufacturing process according to the fifth embodiment of the present invention.

In other words, as shown in FIG. 11, when a silicide layer 37 is formed, a polymetal gate electrode 200 is not yet formed, and therefore it is a non-metal dummy gate electrode 100. Consequently, it becomes possible to execute a heat process (for example, at 600° C. for about 30 minutes) for siliciding. Further, the silicide layer 37 and the dummy gate electrode 100 are separated from each other by the side wall insulation film 7 or the like. With this structure, it is possible to avoid the short-circuiting between the silicide layer 37 and the gate electrode 200.

Fifth Embodiment

The fifth embodiment of the present invention will now be described. In this embodiment, an epitaxial Si layer 38 is selectively formed to have a thickness of about 50 nm, on the surface of the source-drain diffusion layer 6, in place of the ordinary source-drain diffusion layer, for the purpose of decreasing the resistance of the source-drain diffusion layer. It is possible that the ion implantation to the source-drain layer is carried out after the formation of the epitaxial Si layer 38, or the ion implantation to the source-drain layer is carried out before the formation of the epitaxial Si layer 38.

In this embodiment, when a selective epitaxial Si layer 38 is formed, a polymetal gate electrode 200 is not yet formed, and therefore it is a non-metal dummy gate electrode 100. Consequently, it becomes possible to execute a heat process (for example, the pre-process for removing a natural oxide layer on the Si surface, carried out at about 1000° C., or the Si epitaxial growth carried out at about 700° C.) for selectively growing epitaxial Si. Further, the silicide layer 37 and the dummy gate electrode 100 are separated from each other by the side wall insulation film 7 or the like. With this structure, it is possible to avoid the short-circuiting between the silicide layer 37 and the gate electrode 200. After the epitaxial layer formation, n⁺ source and drain and channel ion implantation is able to be carried out.

Sixth Embodiment

The sixth embodiment of the present invention will now be described. We discussed, in the first embodiment, the formation of the contact plug and the metal layer of the gate electrode 200 in separate steps, whereas in this embodiment, the contact plug and the metal layer of the gate electrode 200 are formed at the same time in one step.

Figure 13A:
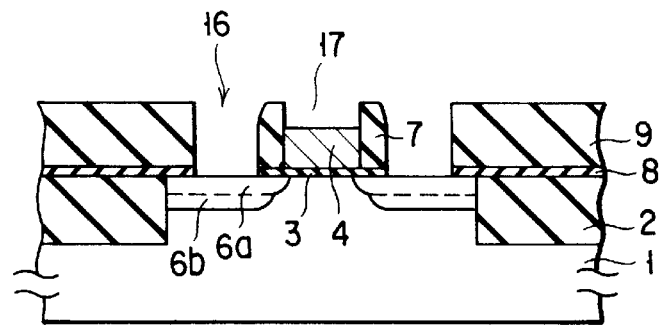
FIG. 13A is a diagram showing a cross sectional view of a product in process after a step of forming a plug hole and removing a cap layer at the same time, which follows the step shown in FIG. 4C, in a manufacturing process according to the sixth embodiment.

FIG. 13A shows a step which follows the step shown in FIG. 4C. As can be seen in this figure, first, the exposed portions of the stopper film 8 and cap layer 5 are selectively removed by the RIE method, or with a hot phosphate solution ($H_3PO_4$ solution at 165° C.) or a glycerol solution of hydrofluoric acid, after the formation of the plug hole 16. Thus, a gate patterned groove 17, and at the same time, the surface of the diffusion layer 6a, exposed as the bottom of the plug hole 16, the surface of the substrate 1, and the surface of the polysilicon layer 4 is exposed.

Figure 13B:
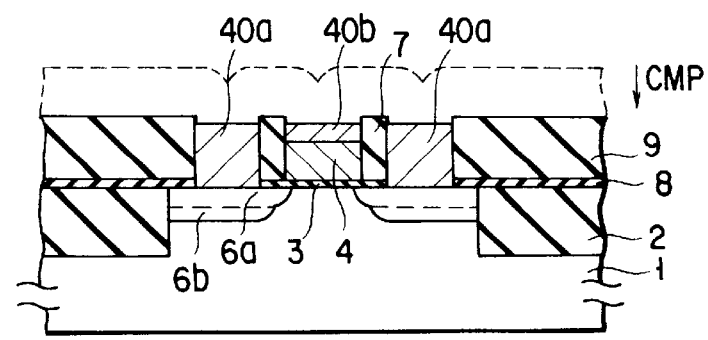
FIG. 13B is a diagram showing a cross sectional view of a product in process after a step of forming a plug hole, which follows the step shown in FIG. 13A.

Then, as shown in FIG. 13B, a metal, which is a single or lamination layer of tungsten (W), Ru, TiN and tungsten nitride ($WN_x$), is deposited on the entire surface of the substrate. After that, with use of the CMP technique, the metal regionally remains in the gate patterned groove 17, thereby completing a metal gate electrode 40b. Further, the metal portion remains in the plug hole 16, thus completing the contact plug 40a. Naturally, the CMP conditions should be selected so that the CMP rate for the metal is slightly higher than those of the BPSG layer 9 and the $SiO_2$ layer 7 (that is, the metal CMP condition is selected). In this time, only for the bottom of the contact hole 16, $TiSi_2$ layer can be formed selectively to reduce the contact resistivity.

With the above described manufacturing method, the contact plug and the metal gate electrode are formed at the same time, thus simplifying the manufacturing process. The other merits are the same as those of the first embodiment.

Seventh Embodiment

The seventh embodiment of the present invention will now be described. In the sixth embodiment, the formation of the contact plug and the metal gate electrode at the same time was discussed, whereas in this embodiment, a material which can be easily removed in a later step is, in advance, is embedded in the contact plug forming region, during the formation of the contact plug.

Figure 14A:
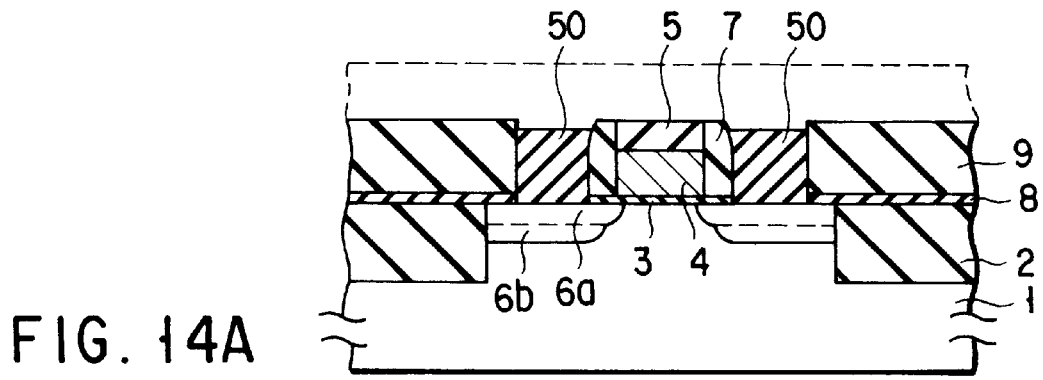
FIG. 14A is a diagram showing a cross sectional view of a product in process after a step of forming a dummy plug in a plug hole, which follows the step shown in FIG. 4C, in a manufacturing process according to the seventh embodiment.

FIG. 14A shows a step which follows the step shown in FIG. 4C. As can be seen in this figure, first, the portion of the stopper film 8, exposed as the bottom portion of the plug hole 16 is removed by the RIE method, and thus the surface of the substrate 1 is exposed. Thereafter, a coating-type oxide layer (SOG (spin on glass) and $SiO_2$-like layer (for example, FOX or the like) are formed in the plug hole 16. These layers can be transformed each into an oxide layer by two-temperature baking at about 200° C. and 400° C. After that, the entire surface is subjected to the CMP and thus a dummy plug 50 such as of SOG or FOX is formed in the plug hole 16. It should be noted that SOG and FOX, for example, have a property that the etching rate of each with respect to a diluted hydrofluoric acid solution or the like, is about 100 times as high as compared to the case of an ordinary oxide layer. Further, FOX has a property that it can be etched by such an alkali solution which cannot etch an ordinary oxide layer.

Figure 14B:
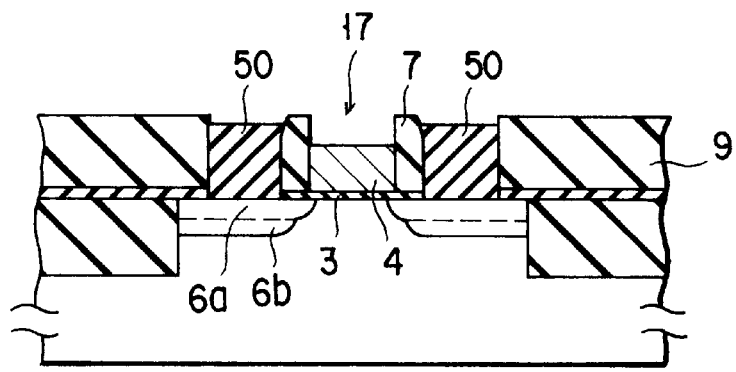
FIG. 14B is a diagram showing a cross sectional view of a product in process after a step of removing the cap layer, which follows the step shown in FIG. 14A.

Next, as can be seen in FIG. 14B, the exposed cap layer 5 is removed selectively with regard to the oxide layer and Si, using a hot phosphate solution ($H_3PO_4$ solution at 165° C.) or a glycerol solution of hydrofluoric acid. During this operation, the plug hole 16 is not etched since it is covered by the dummy plug 50.

Figure 14C:
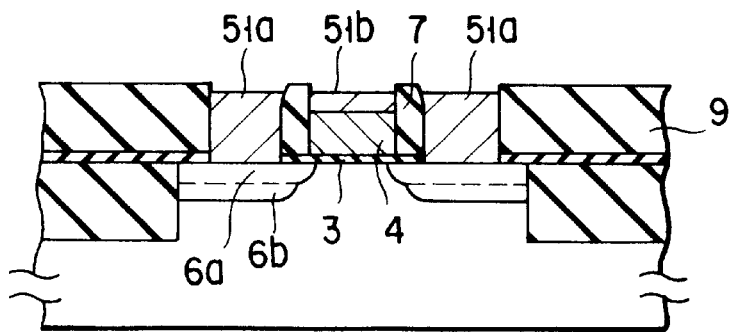
FIG. 14C is a diagram showing a cross sectional view of a product in process after a step of forming a metal layer, which follows the step shown in FIG. 14B.

Next, as shown in FIG. 14C, the FOX layer in the contact plug region is selectively removed by dipping it in, for example, an alkali solution (for example, a developing solution used for developing a resist).

Then, a metal, which is a single or lamination layer of tungsten (W), Ru, TiN and tungsten nitride ($WN_x$), is deposited on the entire surface of the substrate. After that, with use of the CMP technique, the metal regionally remains in the gate patterned groove 17, thereby completing a metal layer 51a of a polymetal gate electrode. Further, the metal portion remains in the plug hole 16, thus completing the contact plug 51a. Naturally, the CMP conditions should be selected so that the CMP rate for the metal is higher than those of the BPSG layer 9 and the $SiO_2$ layer 7 (that is, the metal CMP condition is selected).

With the above described manufacturing method, the corrosion of the stopper film 8 at the corners of the bottom of the contact plug region can be prevented. Further, as in the case of the sixth embodiment, the contact plug and the metal gate electrode are formed at the same time, thus simplifying the manufacturing process. The other merits are the same as those of the first embodiment.

Eighth Embodiment

The seventh embodiment of the present invention will now be described. In the sixth and seventh embodiments, examples of the formation of the metal layer of the polymetal gate electrode and the contact plug at the same time were discussed, whereas in this embodiment, the plug hole 16 is covered in advance with a material which can be easily removed in a later step, during the formation of the contact plug in a metal gate electrode made of solely metal.

Figure 15A:
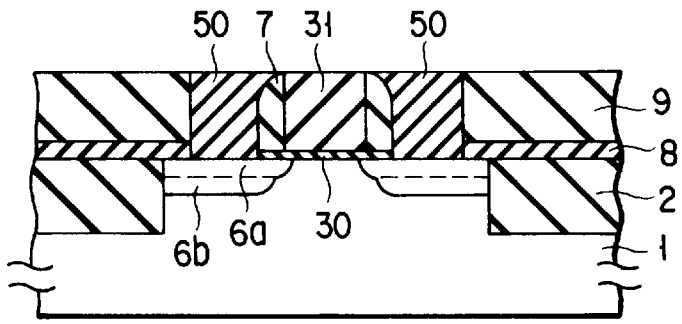
FIG. 15A is a diagram showing a cross sectional view of a product in process after a step of forming a dummy plug in a plug hole, which follows the step shown in FIG. 9C, in a manufacturing process according to the eighth embodiment.

FIG. 15A shows a step which follows the step shown in FIG. 9C. As can be seen in this figure, first, the portion of the stopper film 8 at the bottom portion of the plug hole 16 is removed by the RIE method, and thus the surface of the diffusion layer 6a is exposed. Thereafter, a coating-type oxide layer ($SiO_2$-like layer (for example, FOX or SOG (spin on glass) or the like) is formed in the contact plug region. The layer can be transformed each into an oxide layer by two-temperature baking (at about 150° C.). After that, the entire surface is etched back by the CMP or RIE, and thus a dummy plug 50 such as of SOG or FOX is embedded in the contact plug region. Thus, the surface of the dummy gate electrode 31 is again exposed.

Figure 15B:
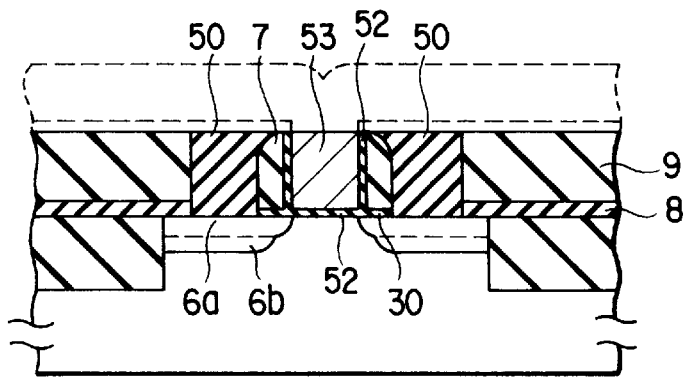
FIG. 15B is a diagram showing a cross sectional view of a product in process after a step of forming a metal gate electrode, which follows the step shown in FIG. 15A.

Next, as can be seen in FIG. 15B, the exposed dummy gate electrode 31 is removed selectively with regard to the oxide layer and Si, using a hot phosphate solution ($H_3PO_4$ solution at 165° C.) or a glycerol solution of hydrofluoric acid. During this operation, the plug hole 16 is not etched since it is covered by the dummy plug 50.

Subsequently, the dummy gate $SiO_2$ layer 30 is removed, and thus the surface of the substrate 1 is exposed. Then, a gate insulation film 52 is formed in the inner wall of the gate patterned groove 17. In this operation, for example, a high dielectric layer (such as $Ta_2O_5$ layer or $(Ba,Sr)TiO_3$ layer) is deposited to have a thickness of about 20 nm. It is also possible here to deposit a high dielectric layer via, for example, a thin $SiO_2$ layer (not shown) having a thickness of, for example, about 1 nm, or a layer (not shown) obtained by directly nitriding the Si surface in an $NH_3$ gas atmosphere using an interface RTP, or an $Si_3N_4$ layer, in order to suppress the creation of an interfacial level or the like between the insulation and the Si interface. Alternatively, it is also possible to use a CVD-SiO$_2$ layer, a CVD-SiO$_x$N$_y$ layer or a laminate including a CVD-Si$_3$N$_4$ as the gate insulation film 34. In these alternative cases, the densification may be carried out by performing a heat process by RTA at a temperature of 1000° C. for about 10 seconds after the layer is formed. In this manner, the insulating properties as an insulation film can be improved, that is, the interfacial level at the Si interface is decreased, or the leak current is decreased. At this point, the metal material is not yet formed in the contact plug region, the restriction for the high temperature step carried out for forming the gate insulation film can be loosened.

Then, a metal layer (35) (Ru, TiN, W and tungsten nitride (WN$_x$)) is deposited to have a single or lamination structure, on the entire surface of the substrate. Naturally, in the case where the gate insulation film is made of a CVD-SiO$_2$ layer, a CVD-SiON layer or a laminate including a CVD-Si$_3$N$_4$, it is possible to use polycrystalline Si to which an impurity is doped, as a gate electrode.

Next, the entire surface is subjected to the CMP, and thus the metal gate electrode 53 remains in the gate pattern groove 17.

Figure 15C:
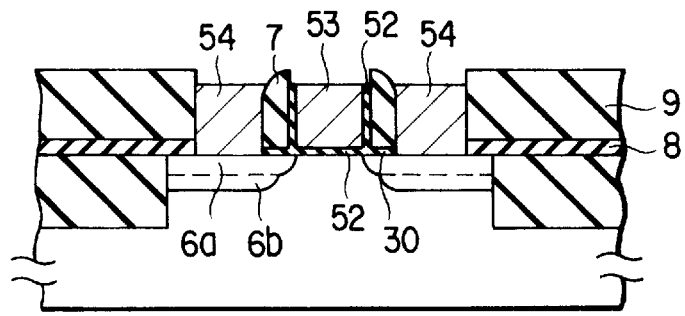
FIG. 15C is a diagram showing a cross sectional view of a product in process after a step of forming a contact plug, which follows the step shown in FIG. 15B.

After that, as shown in FIG. 15C, the dummy plug in the plug hole is selectively removed by dipping it in, for example, an alkali solution (for example, a developing solution used for developing a resist).

Then, a metal, which is a single or lamination layer of tungsten (W), Ru, TiN and tungsten nitride (WN$_x$), is deposited on the entire surface of the substrate. After that, with use of the CMP technique, the contact plug 54 remains in the plug hole. Naturally, the CMP conditions should be selected so that the CMP rate for the metal is higher than those of the BPSG layer 9 and the SiO$_2$ layer 7 (that is, the metal CMP condition is selected).

With the above described manufacturing method, the contact plug and the metal gate electrode can be formed in a self-alignment manner in the case where the gate electrode is made of only a metal. Further, since the contact plug is formed after the formation of the metal gate electrode, the restriction for the high temperature step carried out for forming the gate insulation film can be loosened. The other merits are the same as those of the first embodiment.

Lastly, note that the scope of the present invention is not limited to the above-described embodiments, but can be remodeled into a variety of versions as long as the essence of the invention remains.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:
    a gate electrode formed above a semiconductor substrate via a gate insulation film, the gate electrode containing a semiconductor layer and a metal layer formed on the semiconductor layer, the metal layer constituting an upper portion of said gate electrode, the semiconductor layer constituting a lower portion of said gate electrode;
    a side wall insulation film for surrounding a side wall of the gate electrode;
    an interlayer insulation film formed a predetermined distance away from the side wall insulation film;
    a diffusion layer formed on a surface portion of the substrate and both sides of the gate electrode; and
    a contact plug formed on the diffusion layer and between the side wall insulation film and the interlayer insulation film, the contact plug leveled to substantially a same height as the gate electrode and higher than the semiconductor layer, the contact plug including a metal layer, the metal layer of the contact plug formed thicker than the metal layer of the gate electrode.

2. A semiconductor device according to claim 1, further comprising the side wall insulation film, the interlayer insulation film, and the gate electrode leveled to substantially a same height.

3. A semiconductor device according to claim 1, wherein a surface portion of the contact plug is made of a metal layer made of a same material as a metal layer of the gate electrode.

4. A semiconductor device according to claim 1, wherein the metal layer of the contact plug reaches a surface of the semiconductor substrate.

5. A semiconductor device according to claim 1, wherein the metal layer of the contact plug includes a TiN layer and a W layer.

6. A semiconductor device according to claim 1, further comprising an SiN layer surrounding a lower side surface of the side wall insulation film.

7. A semiconductor device comprising:
    a gate electrode formed above a semiconductor substrate via a gate insulation film, the sate electrode containing a semiconductor layer and a metal layer formed on the semiconductor layer, the metal layer constituting an upper portion of said gate electrode, the semiconductor layer constituting a lower portion of said gate electrode;
    a side wall insulation film for surrounding a side wall of the gate electrode;
    an interlayer insulation film formed a predetermined distance away from the side wall insulation film;
    a diffusion layer formed on a surface portion of the substrate and both sides of the gate electrode;
    a contact plug formed on the diffusion layer and between the side wall insulation film and the interlayer insulation film, the contact plug leveled to substantially a same height as the gate electrode; and
    a contact which contacts a part of an upper surface of the contact plug and a part of a lateral surface of the contact plug.

8. A semiconductor device according to claim 7, further comprising the side wall insulation film and the interlayer insulation film, and the gate electrode leveled to substantially a same height.

9. A semiconductor device according to claim 7, wherein said gate electrode is formed of a metal layer disposed on a semiconductor layer and a surface portion of the contact plug is made of a metal layer made of a same material as the metal layer of the gate electrode.

10. A semiconductor device according to claim 7, further comprising an SiN layer surrounding a lower side surface of the side wall insulation film.

11. A semiconductor device comprising:
    a gate electrode formed above a semiconductor substrate via a gate insulation film, the gate electrode containing a semiconductor layer and a metal layer formed on the semiconductor layer, the metal layer constituting an upper portion of said gate electrode, the semiconductor layer constituting a lower portion of said gate electrode;
    a side wall insulation film for surrounding a side wall of the gate electrode;
    an interlayer insulation film formed a predetermined distance away from the side wall insulation film;

a diffusion layer formed on a surface portion of the substrate and both sides of the gate electrode; and a contact plug formed on the diffusion layer and between the side wall insulation film and the interlayer insulation film, the contact plug leveled to substantially a same height as the gate electrode and higher than semiconductor layer, the contact plug including a metal layer, the metal layer of the contact plug formed thicker than the metal layer of the gate electrode; and a contact which contacts a part of an upper surface of the contact plug and a part of a lateral surface of the contact plug.

12. A semiconductor device according to claim 11, further comprising an SiN layer surrounding a lower side surface of the side wall insulation film.

* * * * *

UNITED STATES PATENT AND TRADEMARK OFFICE
CERTIFICATE OF CORRECTION

PATENT NO.   : 6,072,221
DATED        : June 6, 2000
INVENTOR     : Katsuhiko HIEDA It is certified that error appears in the above-identified patent and that said Letters Patent is hereby corrected as shown below:

Title Page, in the Attorney, Agent, or Firm, line 2, "Garret" should read --Garrett--.

Claim 8, Column 14, line 46, "film and" should read --film,--.

Signed and Sealed this

Twenty-second Day of May, 2001

Attest:

NICHOLAS P. GODICI

Attesting Officer      Acting Director of the United States Patent and Trademark Office